United States Patent
Kobayashi

(10) Patent No.: US 6,184,735 B1
(45) Date of Patent: Feb. 6, 2001

(54) VARIABLE DELAY CIRCUIT

(75) Inventor: Norifumi Kobayashi, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/389,247

(22) Filed: Sep. 3, 1999

(30) Foreign Application Priority Data

Oct. 30, 1998 (JP) .................................. 10-310778

(51) Int. Cl.$^7$ ...................................................... H03K 5/13
(52) U.S. Cl. .......................................... 327/276; 327/270
(58) Field of Search .................................... 327/261, 262, 327/263, 269, 270, 271, 276, 277

(56) References Cited

U.S. PATENT DOCUMENTS

| | | | |
|---|---|---|---|
| 4,939,677 | 7/1990 | Otuji et al. | 364/569 |
| 5,389,843 | * 2/1995 | McKinney | 327/276 |
| 5,646,568 | * 7/1997 | Sato | 327/276 |
| 5,764,093 | * 6/1998 | Hayashi et al. | 327/276 |

FOREIGN PATENT DOCUMENTS

| | | |
|---|---|---|
| 63-090912 | 4/1988 | (JP) . |
| 2582250 | 11/1996 | (JP) . |

* cited by examiner

Primary Examiner—Tuan T. Lam
(74) Attorney, Agent, or Firm—Foley & Lardner

(57) ABSTRACT

A variable delay circuit comprises: a variable delay part having n ($\geq 2$) cascade-connected delay parts, each of which has a delay element, a selecting circuit for selecting whether an input signal is allowed to pass through the delay element, and an OR gate for outputting an output of the selected delay element or the input signal; and a control part for selecting at least one of the plurality of delay parts on the basis of desired delay time information to transmit a control signal for operating so that the selecting circuit in the selected delay part selects a corresponding one of the delay elements, wherein a designed delay time value $D_k$ of the delay element of a number k ($1 \leq k \leq n$) delay part meets the following conditions. Thus, it is possible to provide a smaller circuit scale of a variable delay circuit.

6 Claims, 7 Drawing Sheets

VARIABLE DELAY CIRCUIT

BACKGROUND OF THE INVENTION

1. Field of The Invention

The present invention relates generally to a variable delay circuit.

2. Description of The Related Art

Referring to FIGS. 3 through 8, some examples of conventional variable delay circuits will be described below.

The construction of a first conventional variable delay circuit 20 is shown in FIG. 3. This variable delay circuit is called a current stubbed inverter comprising P-channel MOS transistors 22, 23 and N-channel MOS transistors 24, 25, and widely used for PLL circuits, DLL circuits and so forth. The variable delay circuit 20 is designed so that a charging current of a load capacity supplied from a power supply 28 by controlling voltages $V_{cp}$, $V_{cn}$, which are applied to the gates of the transistors 22, 25 when a trailing edge signal is inputted to an input terminal 21, is changed by ON resisters R of the transistors 22, 25 and a parasitic capacity C to optionally set a delay time of a leading edge signal appearing at an output terminal 27. Furthermore, the voltage $V_{cn}$ is an inverted signal of the voltage $V_{cp}$.

In the first conventional example, it is required to very precisely control the voltages $V_{cp}$, $V_{cn}$ in order to obtain a high resolution, so that it is difficult to use the variable delay circuit for a CMOS semiconductor integrated circuit having a large variation in process.

The construction of a second conventional variable delay circuit 30 is shown in FIG. 4. This variable delay circuit 30 comprises an inverter 31 comprising a P-channel MOS transistor 32 and an N-channel MOS transistor 34, and a transfer gate 36 connected to an output terminal of the inverter 31 in series. The gate voltages $V_{cp}$, $V_{cn}$ of the transfer gate 36 are controlled to make a series resister (on resister) variable, so that an RC time constant varies to allow a propagation delay time to vary.

In the second conventional example similar to the first conventional example, there is a problem in that it is required to very precisely control the voltages $V_{cp}$, $V_{cn}$ so that it is not possible to use the variable delay circuit for a CMOS semiconductor integrated circuit having a large variation in process.

The construction of a third conventional variable delay circuit 40 is shown in FIG. 5. This variable delay circuit 40 comprises an inverter comprising a P-channel MOS transistor 42 and an N-channel MOS transistor 44, and a variable load capacitor 46 connected to an output terminal 47 of the inverter. The load capacitor 46 is adjusted to change an RC time constant to allow a propagation delay time to vary. In the third conventional example, it is typically realized by controlling using, e.g., an analog switch, whether the load capacitor 46 having a predetermined capacity is connected to the output terminal 47. Therefore, there is a problem in that it is difficult to precisely control a propagation delay time under the influence of a parasitic capacity added by connecting control means, such as the analog switch, to the output terminal 47.

In addition, the precision of the production of the capacitor must be high, so that it is very difficult to produce variable delay circuits in large quantities in view of the variation in CMOS producing process.

The construction of a fourth conventional variable delay circuit 50 is shown in FIG. 6. This variable delay circuit 50 has an inverter comprising a P-channel MOS transistor 52 and an N-channel MOS transistor 54. By controlling the back gate voltage of each of these transistors 52, 54, the threshold voltage of each of the transistors 52, 54 is controlled to adjust a propagation delay time. In the fourth delay circuit, it is required to enhance the control precise of the back gate voltage in order to obtain a high resolution, so that it is difficult to realize the delay circuit for a CMOS semiconductor integrated circuit having a great variation in producing process.

The construction of a fifth conventional variable delay circuit is shown in FIG. 7. This delay circuit has a plurality of delay parts $5_1, \ldots, 5_n$ which are cascade-connected. Each of the delay parts $5_i$ (i=1, ..., n) comprises a delay element $3_i$, a multiplexer $2_i$ for selecting whether an input signal is allowed to pass through the delay element $3_i$ and an OR gate $4_i$ for transmitting an output of the selected delay element or the input signal to the subsequent stage of delay part.

Even if the fifth conventional variable delay circuit is used, it is not ensured to obtain a desired delay time. The delay time of the variable delay circuit is determined by the set value Span of the maximum delay time and a resolution (the minimum delay time) Res. An optional delay time thus obtained is about integer times as large as the resolution Res.

A conventional example of a variable delay circuit capable of solving the problem of the fifth conventional variable delay circuit will be described as a sixth conventional variable delay circuit.

The construction of the sixth conventional variable delay circuit will be described in FIG. 8. This delay circuit is disclosed in Japanese Patent Laid-Open No. 2582250. This delay circuit is formed by providing the variable delay circuit of FIG. 7 with a control circuit 6 for controlling each stage of multiplexer. In order to obtain a desired delay time, the set delay time value $D_k$ of each delay element $3_k$ (k=1, ..., n) is defined so as to satisfy the following formulae.

$$D_k = \left\{ (1-dr) \times \sum_{i=1}^{k-1} D_i + Res/(1+da) \right\} / (1+dr) \quad (1a)$$

wherein when $$k=1, D_1=\{Res/(1+da)\}/(1+dr) \quad (1b)$$

wherein Res is a resolution of a variable delay circuit, da being an absolute value of an absolute error at a designed delay time $D_k$, and dr being an absolute value of a relative error.

The actual delay time value of each delay element $3_k$ is equal to the designed value if there is no error, and the characteristic thereof is shown by line $g_0$ in FIG. 9. However, this characteristic varies due to the variation in producing process, the fluctuation of working environment (temperature and power supply voltage) and so forth, so that the characteristic is included in a region between lines $g_1$ and $g_2$ in FIG. 9. This region of the variation in characteristic corresponds to the absolute error da (see FIG. 9). Even in the case of substantially the same characteristic, there is a variation of the characteristic as shown by points $P_1$, $P_2$ in FIG. 9. This variation corresponds to the relative error dr.

In the sixth conventional variable delay circuit, as can be seen from formulae (1a) and (1b), the set delay time value $D_k$ of each delay elements $3_k$ (k=1, .., n) is derived on the basis of the preset resolution Res, the absolute error da and the relative error dr. In this case, the designed delay time values are sequentially derived in order of smaller value.

Thus, each delay element $3_k$ (k=1, ..., n) is derived. When the maximum delay time derived from the delay times $D_1, \ldots, D_n$ of the delay elements $3_1, \ldots, 3_n$ is smaller than the predetermined value Span previously given, a delay element $3_{n+1}$ is newly added so that the resulting maximum delay time is greater than the predetermined value Span. At this time, the delay time of the added delay element $3_{n+1}$ is set so as to satisfy formula (1a). Therefore, the delay time $D_{n+1}$ of the added delay element has a greater value than any delay time values $D_i$ (i=1, . . . , n) of other delay elements $3_1, \ldots, 3_n$. For that reason, there is a problem in that the circuit scale of a variable delay circuit increases.

SUMMARY OF THE INVENTION

It is therefore an object of the present invention to eliminate the aforementioned problems and to provide a variable delay circuit capable of realizing a desired delay time by a smaller circuit scale.

In order to accomplish the aforementioned and other objects, according to a first aspect of the present invention, a variable delay circuit comprises: a variable delay part having n ($\geq 2$) cascade-connected delay parts, each of which has a delay element, a selecting circuit for selecting whether an input signal is allowed to pass through the delay element, and an OR gate for outputting an output of the selected delay element or the input signal; and control means for selecting at least one of the plurality of delay parts on the basis of desired delay time information to transmit a control signal for operating so that the selecting circuit in the selected delay part selects a corresponding one of the delay elements, wherein assuming that a variable width of a delay time is Span, a resolution being Res, and absolute and relative errors being da and dr, respectively, then, a designed delay time $D_k$ of the delay element of a number k ($1 \leq k \leq n$) delay part meets the following conditions.

$$D_1 = \text{Span}/(1-da)/2$$

$$D_2 = (\text{Span}/(1-da)/2) \times (1+dr)/2$$

when $k \geq 3$, $$D_k = \left\{ (\text{Span}/(1-da)/2) \times (1+dr) - \sum_{i=1}^{k-1} D_i \times (1-dr) \right\} / 2$$

$$\text{Span} < \sum_{i=1}^{n} (D_i \times (1-da))$$

$$D_n \times (1+da) \times (1+dr) < \text{Res}$$

According to a second aspect of the present invention, a variable delay circuit comprises: a variable delay part having n ($\geq 2$) cascade-connected delay parts, each of which has a delay element, a selecting circuit for selecting whether an input signal is allowed to pass through the delay element, and an OR gate for outputting an output of the selected delay element or the input signal; and control means for selecting at least one of the plurality of delay parts on the basis of desired delay time information to transmit a control signal for operating so that the selecting circuit in the selected delay part selects a corresponding one of the delay elements, wherein assuming that a variable width of a delay time is Span, a resolution being Res, the best and worst values of absolute errors of the whole delay time being dab and daw, respectively, and the best and worst values of relative errors of the delay time of a delay element of a number i ($1 \leq i \leq n$) delay part being drbi and drwi, respectively, then, a designed delay time $D_k$ of the delay element of a number k ($1 \leq k \leq n$) delay part meets the following conditions.

$$D_1 = \text{Span}/(1-dab)/2$$

$$D_2 = (\text{Span}/(1-dab)/2) \times (1+drw1)/2$$

when $k \geq 3$, $$D_k = \left\{ (\text{Span}/(1-dab)/2) \times (1+drwl) - \sum_{i=1}^{k-1} D_i \times (1-drbi) \right\} / 2$$

$$\text{Span} < \sum_{i=1}^{n} (D_i \times (1-dab))$$

$$D_n \times (1+daw) \times (1+drwn) < \text{Res}$$

According to a third aspect of the present invention, a variable delay circuit comprises: a variable delay part having n ($\geq 2$) cascade-connected delay parts, each of which has a delay element, a selecting circuit for selecting whether an input signal is allowed to pass through the delay element, and an OR gate for outputting an output of the selected delay element or the input signal; and control means for selecting at least one of the plurality of delay parts on the basis of desired delay time information to transmit a control signal for operating so that the selecting circuit in the selected delay part selects a corresponding one of the delay elements, wherein assuming that a variable width of a delay time is Span, a resolution being Res, the best and worst values of absolute errors of the whole delay time being dab and daw, respectively, the best and worst values of relative errors of the delay time of a delay element of a number i ($1 \leq i \leq n$) delay part being drbi and drwi, respectively, and OPT being a positive number, then, a designed delay time $D_k$ of the delay element of a number k ($1 \leq i \leq n$) delay part meets the following conditions.

$$D_1 = \text{Span}/(1-dab)/2 - \text{OPT}$$

$$D_2 = \{\text{Span}/(1-dab)/2) \times (1+drw1) - \text{OPT}\}/2$$

when $k \geq 3$, $$D_k = \left\{ (\text{Span}/(1-dab)/2) \times (1+drwl) - \text{OPT} - \sum_{i=1}^{k-1} D_i \times (1-drbi) \right\} / 2$$

$$\text{Span} < \sum_{i=1}^{n} (D_i \times (1-dab))$$

$$D_n \times (1+daw) \times (1+drwn) < \text{Res}$$

The variable delay part may be divided into a first variable delay part having m ($2 \leq m \leq n-2$) cascade-connected delay parts and a second variable delay part having n-m cascade-connected delay parts, the delay time information may be a coded n-bit signal, and the control means may be divided into first and second control circuits, the first control circuit selecting one from the delay parts of the first variable delay part on the basis of the upper m bits of the delay time information, and outputting a control signal for operating so that the selecting circuit in the selected delay part selects a corresponding delay element, the first control circuit having a table including information on the difference between the designed delay time from the selected delay part and an actual delay time, and the second control circuit selecting one from the delay parts of the second variable delay part on the basis of the information on the difference outputted from the first control circuit, and outputting a control signal for operating so that the selecting circuit in the selected delay part selects a corresponding one of the delay elements.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1:
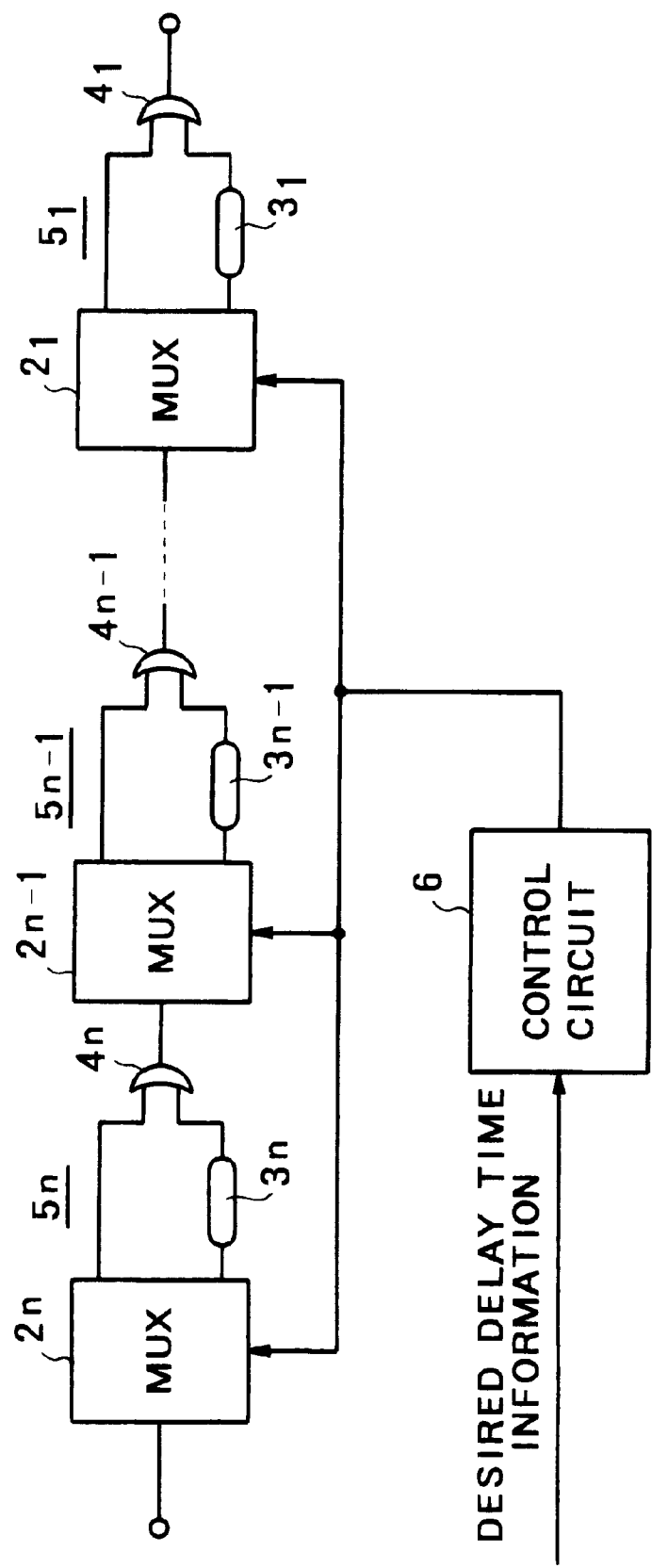
FIG. 1 is a block diagram of the first preferred embodiment of a variable delay circuit according to the present invention.

Referring now to the accompanying drawings, particularly to FIG. 1, the first preferred embodiment of a variable delay circuit according to the present invention will be described below.

Figure 8:
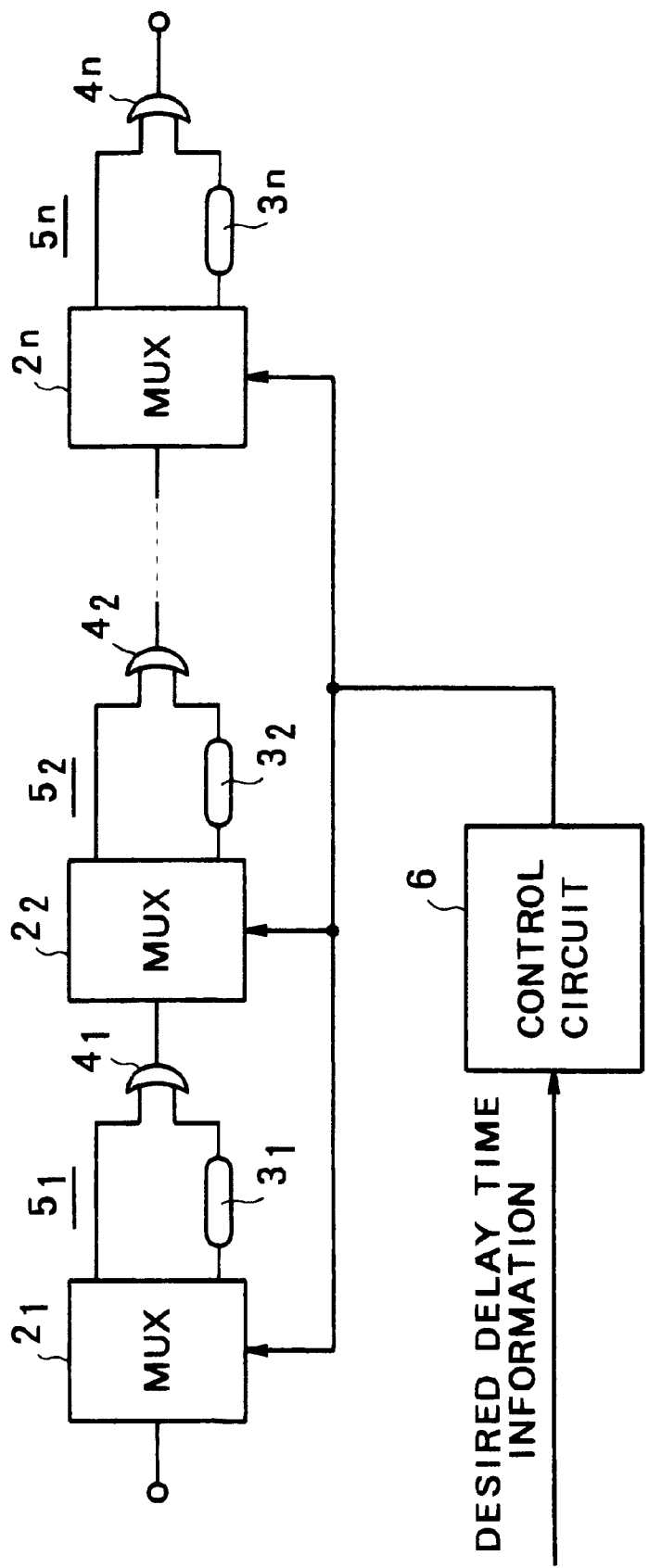
FIG. 8 is a circuit diagram of a sixth example of a conventional variable delay circuit.
Figure 9:
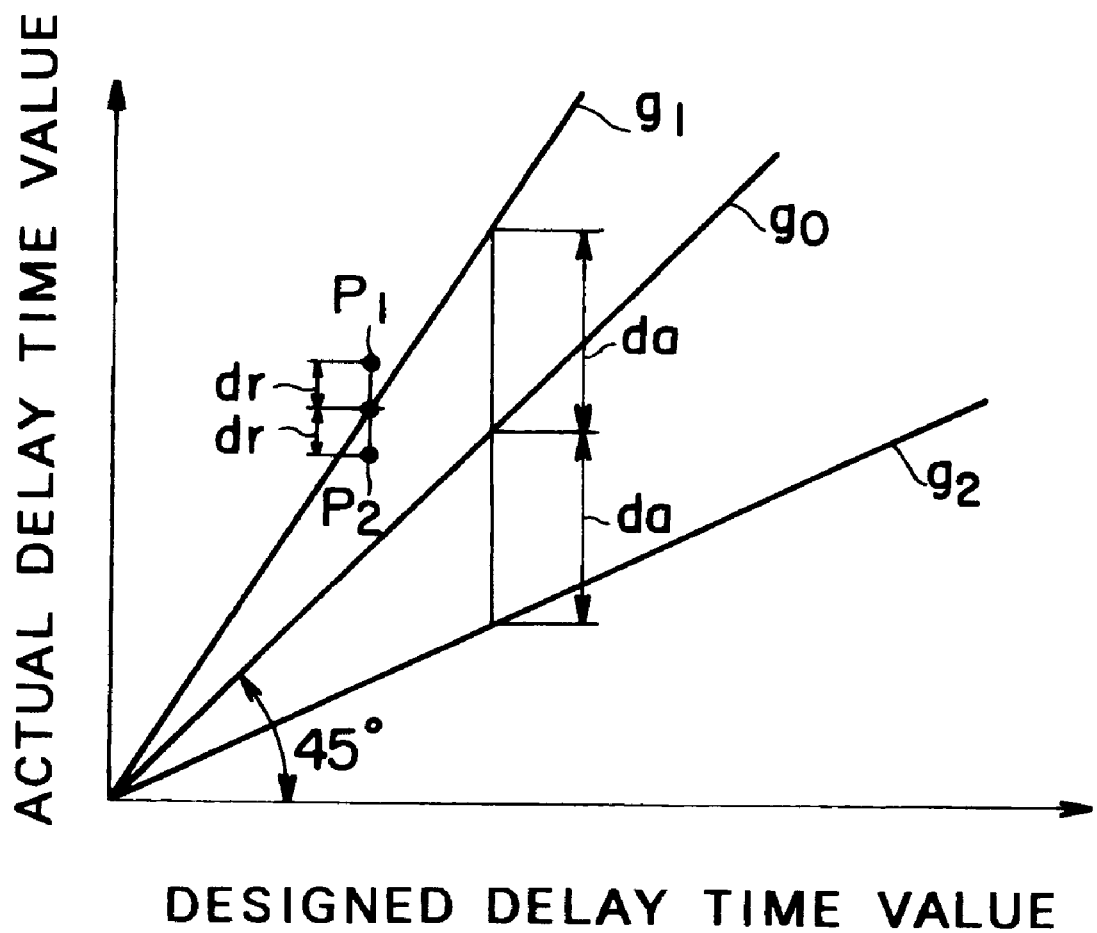
FIG. 9 is a graph for explaining an absolute error and a relative error.

In this preferred embodiment, a variable delay circuit comprises a variable delay part including a plurality of delay parts $5_1, \ldots, 5_n$ which are cascade-connected, and a control circuit 6. In this preferred embodiment, the delay parts $5_1, \ldots, 5_n$ are numbered so that the subscript of the reference number of a certain stage is smaller than that of the subsequent stage unlike the conventional case shown in FIG. 8. Similar to the conventional case, each of the delay parts $5_i$ (i=1, ..., n) comprises a delay element $3_i$, a multiplexer $2_i$ for selecting whether an input signal is allowed to the delay element $3_i$, and an OR gate $4_i$ for transmitting an output of the selected delay element or the input signal to the subsequent stage of delay part.

Then, a set delay time value $D_k$ of each of the delay parts $5_k$ (k=1, ..., n) is derived by the following formulae (2a) and (2b).

$$D_k = \left\{(\text{Span}/(1-da)/2) \times (1+dr) - \sum_{i=1}^{k-1} D_i \times (1-dr)\right\}/2 \quad (2a)$$

wherein when $$k=1, D_1=\text{Span}/(1-da)/2$$

when $$k=2, D_2=(\text{Span}/(1-da)/2)\times(1+dr)/2 \quad (2b)$$

wherein Span is the set value of the maximum delay time, Res being a resolution, da being an absolute error, and dr being a relative error.

In this case, the following convergence determining conditions must be met.

$$D_n \times (1+da) \times (1+dr) < \text{Res} \quad (3a)$$

$$\text{Span} < \sum_{i=1}^{n} (D_i \times (1-da)) \quad (3b)$$

If the above described convergence determining conditions are not met, a delay part $5_{n+1}$ is newly provided. Then, if the delay time $D_{n+1}$ of the delay element $3_{n+1}$ of the delay part $5_{n+1}$ meets the above described convergence determining conditions, it is completed to provide any additional delay parts, and if the delay time $D_{n+1}$ does not meet the conditions, it is continued to provide additional delay parts until the delay time $D_{n+1}$ meets the conditions.

From the delay parts $5_1$ through $5_n$ thus constructed, the control circuit 6 selects one delay part on the basis of desired delay time information. Then, in the selected delay part $5_j$ ($1 \leq j \leq n$), the multiplexer $2_j$ operates so that the received input signal passes through the delay element $3_j$. Furthermore, the above described desired delay time information is coded. When the number of stages of delay parts of the variable delay circuit is n, the above described delay information is an n-bit signal.

In the variation delay circuit according to this preferred embodiment, the set delay time value $D_k$ of the delay element $3_k$ of each of the delay parts $5_k$ (k=1, ..., n) meets the formulae (2a) and (2b). That is, the set delay time values of delay elements are sequentially determined in order of greater set value on the basis of the set value Span of the maximum delay time value and the resolution Res. Thus, in this preferred embodiment, even if it is required to add a delay part, it is enough to add a delay part having a small set delay time value. Therefore, the whole circuit scale can be smaller than that of the conventional variable circuit of FIG. 8 wherein the set delay time values of variable elements are sequentially determined in order of smaller set value.

This will be described using examples of calculation in this preferred embodiment and conventional case. Now, variable delay circuits of a specification having an absolute error da of 0.5, a relative error dr of 0.1, a variable width set value Span of 3875 ps and a resolution Res of 125 ps are designed in this preferred embodiment using the formulae (2a), (2b), (3a) and (3b) and in the conventional example using the formulae (1a) and (1b). Then, the number of stages of delay parts is eight, and the set delay time values T1 through T8 of the respective delay parts are shown in the following table. Furthermore, $T_i=D_{9-i}$ (i=1, ..., 8) in this preferred embodiment, and $T_i=D_i$ (i=1, ..., 8) in the conventional example.

|    | Preferred Embodiment | Conventional Example |
|----|---------------------|---------------------|
| T1 | 56ps                | 76ps                |
| T2 | 107ps               | 138ps               |
| T3 | 195ps               | 250ps               |

-continued

| Preferred Embodiment | Conventional Example |
|---|---|
| T4 | 355ps | 455ps |
| T5 | 645ps | 828ps |
| T6 | 1172ps | 1505ps |
| T7 | 2131ps | 2737ps |
| T8 | 3875ps | 4976ps |
| Total | 8536ps | 10965ps |

It can be seen from the above table that the total delay time realized by the whole variable delay circuit is 8536 ps in this preferred embodiment, and 10965 ps in the conventional example. Thus, the circuit scale in this preferred embodiment can be smaller than that in the conventional example.

Then, a first modified example of the above described preferred embodiment will be described. The formulae (2a), (2b), (3a) and (3b) for use in the above described preferred embodiment do not include every phenomena which may occur in an actual semiconductor integrated circuit. That is, the relative error dr varies every delay element. In addition, the relative error when the delay time increases is different from the relative error when the delay time decreases. Specifically, it is assumed that the first stage of delay element has a delay time of 1 ns in an ideal state, and the second stage of delay element has a delay time of 2 ns in an ideal state. It is also assumed that, on the worst condition wherein the delay time increases, the first stage of delay element has a delay time of 1.5 ns whereas the second stage of delay element has a delay time of 2.8 ns, and on the best condition wherein the delay time decreases, the first stage of delay element has a delay time of 0.6 ns whereas the second stage of delay element has a delay time of 1.4 ns. In this case, the relative errors will be as follows.

Relative element on the best side of the first stage of delay element body: $drb1=0.4$ Relative element on the worst side of the first stage of delay element body: $drw1=0.5$ Relative element on the best side of the second stage of delay element body: $drb2=0.3$ Relative element on the worst side of the second stage of delay element body: $drw2=0.4$ Thus, each of the delay elements has different values on the best and worst sides. This can not be considered in the above described preferred embodiment.

Therefore, in the first modified example, the set delay time value $D_k$ of each delay element $3_k$ (k=1, ..., n) is derived using the following formulas (4a) and (4b) in place of the formulae (2a) and (2b).

$$D_k = \left\{(\text{Span}/(1-dab)/2) \times (1+drwl) - \sum_{i=1}^{k-1} D_i \times (1-drwl)\right\}/2 \quad (4a)$$

wherein when $k=1, D_1=\text{Span}/(1-dab)/2$ when $k=2, D_2=(\text{Span}/(1-dab)/2)\times(1+drw1)/2 \quad (4b)$ wherein dab is the best value of the absolute value of the whole variable delay circuit, drbi being the best value of the relative error of a number n+1−i stage of delay element, and drw1 being the worst value of the relative error of the uppermost stage of delay element.

Furthermore, the convergence determining conditions in the above described modified example can be expressed by the following formulae (5a) and (5b).

$$D_n \times (1+daw) \times (1+drwn) < \text{Res} \quad (5a)$$

$$\text{Span} < \sum_{i=1}^{n} (D_i \times (1-dab)) \quad (5b)$$

wherein daw is the worst value of the absolute value of the whole variable delay circuit, and drwn is the worst value of the relative error in the first stage.

If the first modified example is applied to the calculated examples described in the first preferred embodiment, the results are shown in the following table.

| | Best Value of dr | Worst Value of dr | Delay Time |
|---|---|---|---|
| T1 | 0.8 | 1.2 | 53ps |
| T2 | 0.8 | 1.2 | 89ps |
| T3 | 0.9 | 1.1 | 162ps |
| T4 | 0.9 | 1.1 | 294ps |
| T5 | 0.95 | 1.05 | 561ps |
| T6 | 0.95 | 1.05 | 1068ps |
| T7 | 0.95 | 1.05 | 2034ps |
| T8 | 0.95 | 1.05 | 3875ps |
| Total | | | 8136ps |

It can be seen from the above table that the total delay time is 8136 ps, so that the circuit scale of the variable delay circuit in the first modified example can be smaller than that in the first preferred embodiment.

Then, a second modified example of a variable delay circuit in the first preferred embodiment willbe described. In the second modified example, the variable delay circuit has an optimized designed delay time value $D_k$ (k=1, ... n) of each delay element in a range meeting the variable width Span in the first modified example. The designed value $D_k$ (k=1, ..., n) is derived by the following formulae (6a) and (6b).

$$D_k = \left\{(\text{Span}/(1-dab)/2) \times (1+drwl) - OPT - \sum_{i=1}^{k-1} D_i \times (1-drwi)\right\}/2 \quad (6a)$$

wherein when $k=1, D_1=\text{Span}/(1-dab)/2-OPT$ when $k=2, D_2=\{\text{Span}/(1-dab)/2\times(1+drw1)-OPT\}/2 \quad (6b)$ wherein OPT is the maximum value meeting the specification of a variable width, e.g., the formula (5b), even if the total of calculated delay values Dk is minimum in view of the absolute error.

In addition, the convergence determining conditions are the same as those in the first modified example.

When the second modified example is applied to the calculated examples described in the first preferred embodiment, the results are shown in the following table. In this case, OPT was 184 ps.

| | Best Value of dr | Worst Value of dr | Delay Time |
|---|---|---|---|
| T1 | 0.8 | 1.2 | 51ps |
| T2 | 0.8 | 1.2 | 85ps |
| T3 | 0.9 | 1.1 | 154ps |
| T4 | 0.9 | 1.1 | 280ps |
| T5 | 0.95 | 1.05 | 534ps |
| T6 | 0.95 | 1.05 | 1017ps |
| T7 | 0.95 | 1.05 | 1937ps |
| T8 | 0.95 | 1.05 | 3691ps |
| Total | | | 7748ps |

It can be seen from the above table that the total delay time is 7748 ps, so that the circuit scale of the variable delay circuit in the second modified example can be smaller than that in the first modified example.

In the first preferred embodiment and the first and second modified examples, the desired delay time information to be inputted to the control circuit 8 has been coded. When the variable delay circuit comprises n stages of delay parts, the above described delay information is an n-bit signal. On the other hand, the control circuit 6 has a data table for decoding the n-bit signal. Since the number of the delay time information is $2^n$, there is a problem in that the size of the data table in the control circuit 6 increases to increase the circuit scale as the number of stages of delay parts of the variable delay circuit increases. A variable delay circuit for solving this problem will be described as the second preferred embodiment of the present invention.

Figure 2:
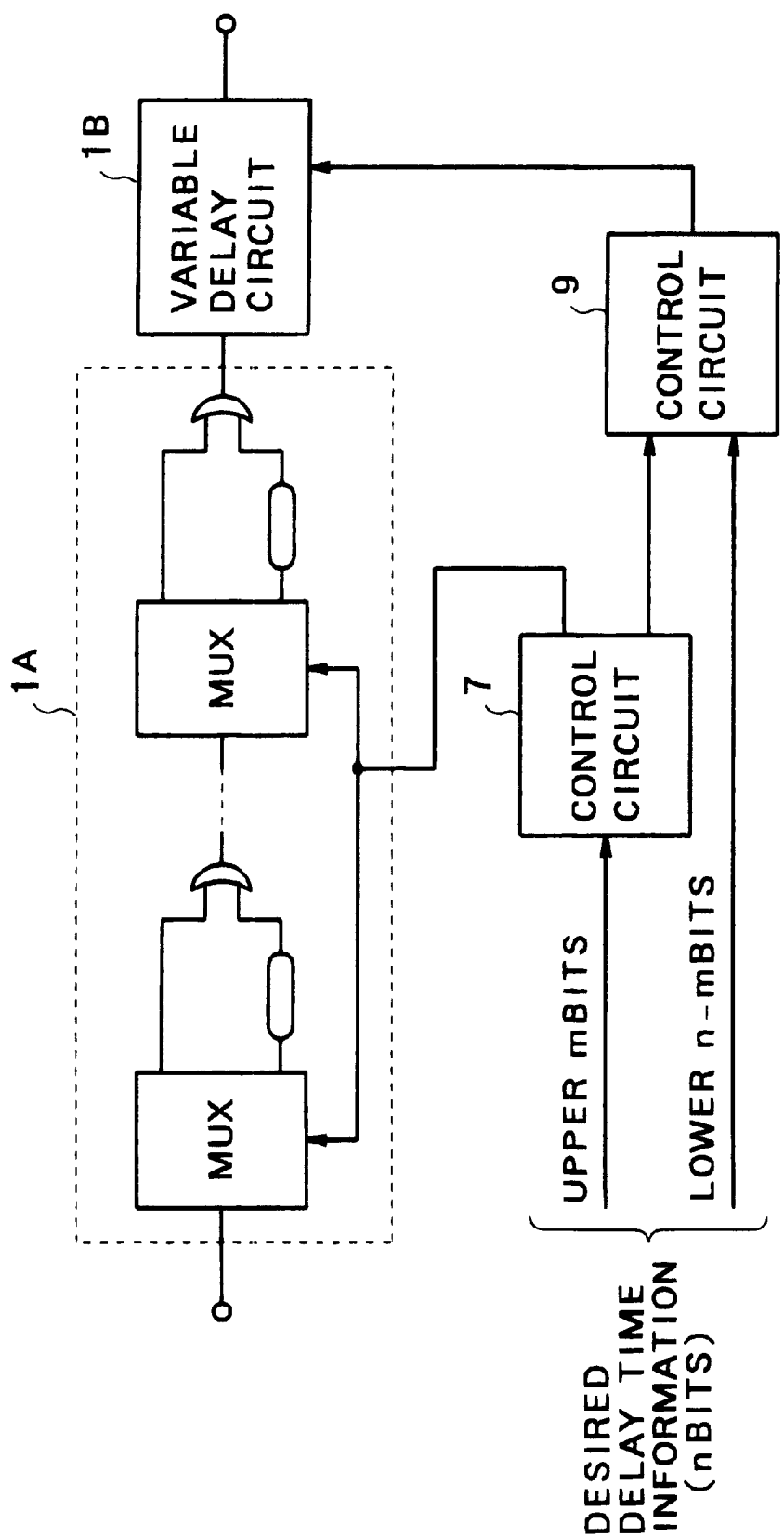
FIG. 2 is a block diagram of the second preferred embodiment of a variable delay circuit according to the present invention.
Figure 3:
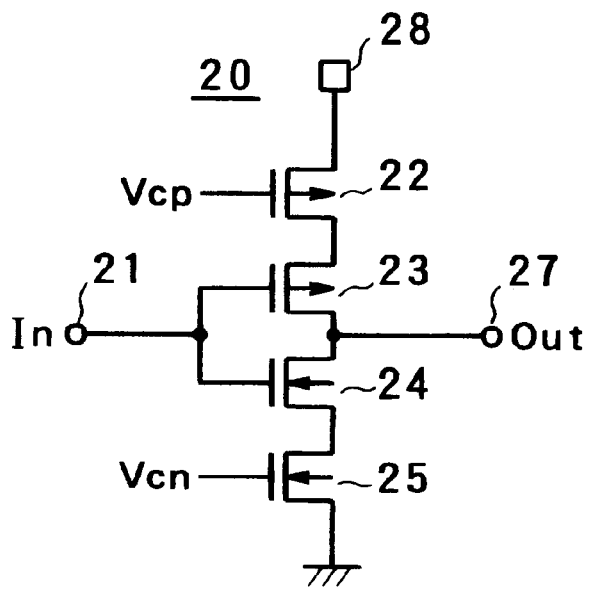
FIG. 3 is a circuit diagram of a first example of a conventional variable delay circuit.
Figure 4:
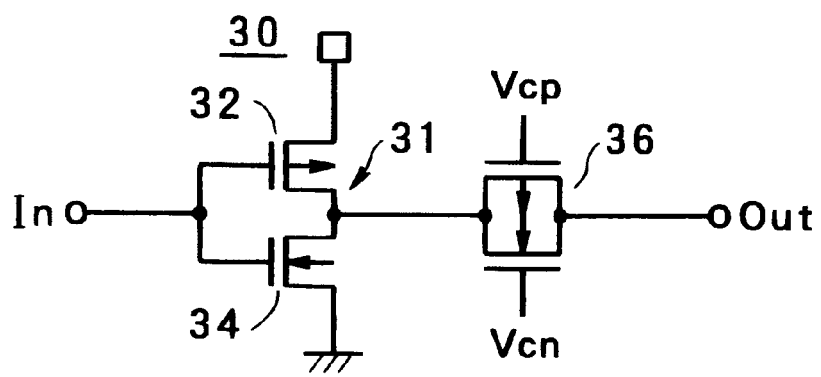
FIG. 4 is a circuit diagram of a second example of a conventional variable delay circuit.
Figure 5:
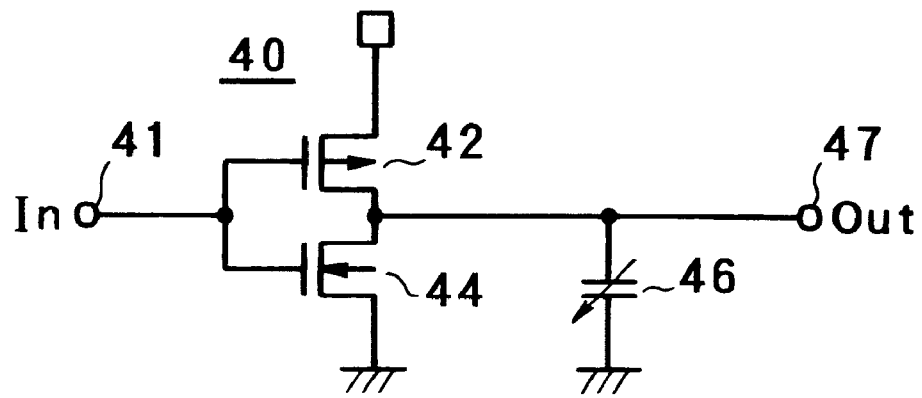
FIG. 5 is a circuit diagram of a third example of a conventional variable delay circuit.
Figure 6:
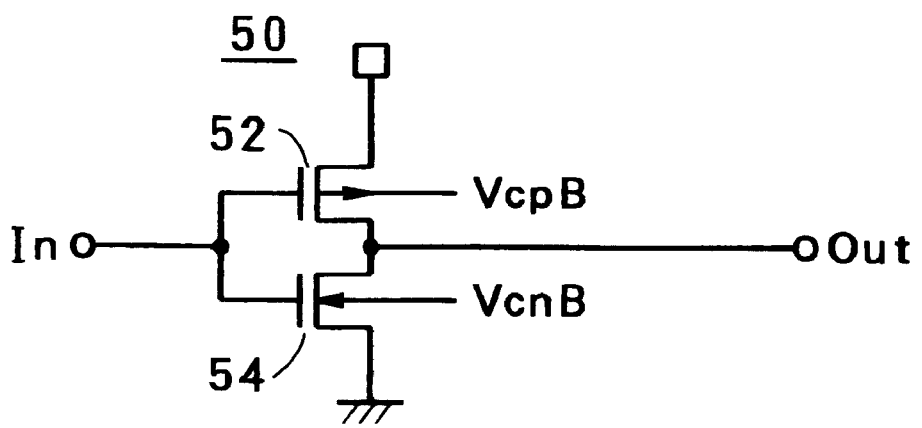
FIG. 6 is a circuit diagram of a fourth example of a conventional variable delay circuit.
Figure 7:
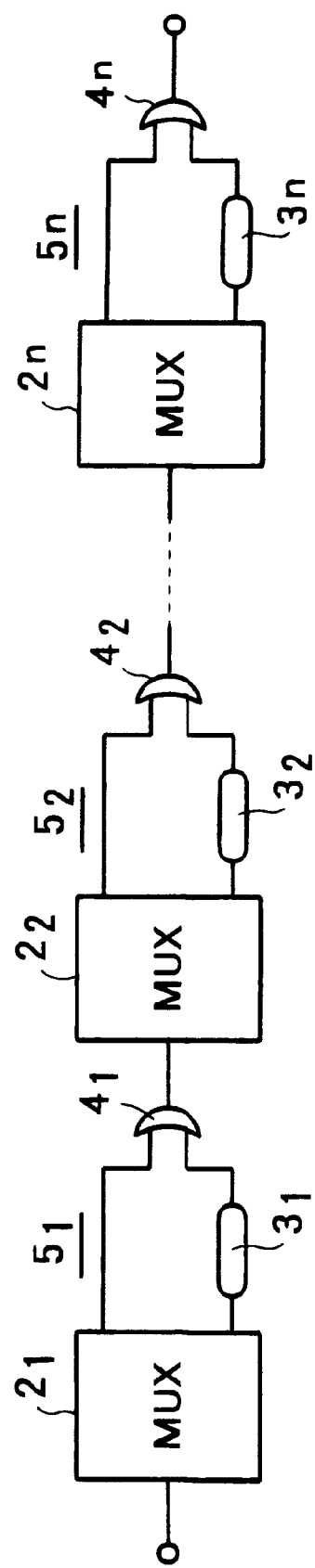
FIG. 7 is a circuit diagram of a fifth example of a conventional variable delay circuit.

The construction of the second preferred embodiment of a variable delay circuit according to the present invention is shown in FIG. 2. In the second preferred embodiment, a variable delay circuit comprises variable delay parts 1A, 1B and control circuits 7, 9. Each of the variable delay parts 1A, 1B comprises a plurality of delay parts which are cascade-connected as described in the first preferred embodiment. The variable delay part 1A is connected to the variable delay 1B in series. The sets of the plurality of delay parts constituting the variable delay parts 1A, 1B are the same as those in any one of the first preferred embodiment and the first and second modified examples. That is, the plurality of stages of delay parts in any one of the first preferred embodiment and the first and second modified examples are put in the proper order, and a circuit thus formed is divided into the two variable delay parts 1A and 1B.

Now, it is assumed that the number of stages of delay parts of the variable delay part 1A is m ($2 \leq m \leq n-2$), and the number of stages of delay parts of the variable delay 1B is n−m.

The control circuit 7 selects a suitable one from the delay parts constituting the variable delay part 1A on the basis of the upper m bits of corded n-bit desired delay time information. Furthermore, the control circuit 7 also has a table including information (which will be hereinafter referred to as "error information") on the difference between the designed delay time value obtained from the selected delay part and an actual delay time, and outputs the error information on the basis of the upper m bits of the coded n-bit delay time information.

The control circuit 9 selects a suitable on from the delay parts constituting the variable delay part 1B on the basis of the lower n-m bits of the n-bit delay time information and the error information.

Furthermore, in the second preferred embodiment, assuming that the variable width and resolution of the variable delay part 1A are span 1 and res1, respectively, and the variable width and resolution of the variable delay part 1B are span2 and res2, respectively, the variable width and resolution of the variable delay circuit being SPAN and RES, respectively, and the error information being ERR, then, it is required to meet the following conditions.

res2<res1<span2

ERR+res2<RES

In the second preferred embodiment, the control circuit 7 has a data table for decoding m-bit signals, and the control circuit 9 has a data table for decoding n-m bit signals. Therefore, in the second preferred embodiment, the size of the data table is $2^m + 2^{n-m}$. On the other hand, in the first preferred embodiment, the size of the data table of the control circuit 6 is $2^n$, and $2^n > 2^m + 2^{n-m}$. Therefore, the size of the data table in the second preferred embodiment can be smaller than that in the first preferred embodiment.

Also in the second preferred embodiment similar to the first preferred embodiment, the circuit scale can be smaller than the conventional case.

As described above, according to the present invention, it is possible to reduce the circuit scale size.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A variable delay circuit comprising:

a variable delay part having n ($\geq 2$) cascade-connected delay parts, each of which has a delay element, a selecting circuit for selecting whether an input signal is allowed to pass through said delay element, and an OR gate for outputting an output of the selected delay element or said input signal; and control means for selecting at least one of said plurality of delay parts on the basis of desired delay time information to transmit a control signal for operating so that the selecting circuit in the selected delay part selects a corresponding one of said delay elements, wherein assuming that a variable width of a delay time is Span, a resolution being Res, and absolute and relative errors being da and dr, respectively, then, a designed delay time value $D_k$ of the delay element of a number k ($1 \leq k \leq n$) delay part meets the following conditions:

$D_1 = \text{Span}/(1-da)/2$ $D_2 = (\text{Span}/(1-da)/2) \times (1+dr)/2$ when $k \geq 3$, $$D_k = \left\{ (\text{Span}/(1-da)/2) \times (1+dr) - \sum_{i=1}^{k-1} D_i \times (1-dr) \right\} / 2$$

$$\text{Span} < \sum_{i=1}^{n} (D_i \times (1-da))$$

$D_n \times (1+da) \times (1+dr) < \text{Res}$.

2. A variable delay circuit as set forth in claim 1, wherein said variable delay part is divided into a first variable delay part having m (2≦m≦n-2) cascade-connected delay parts, and a second variable delay part having n-m cascade-connected delay parts, said desired delay time information being a coded n-bit signal, said control means being divided into first and second control circuits, said first control circuit selecting one from said delay parts of said first variable delay part on the basis of upper m bits of said desired delay time information, and outputting a control signal for operating so that the selecting circuit in the selected delay part selects a corresponding delay element, said first control circuit having a table including information on the difference between the designed delay time value from said selected delay part and an actual delay time, and said second control circuit selecting one from said delay parts of said second variable delay part on the basis of said information on the difference outputted from said first control circuit, and outputting a control signal for operating so that the selecting circuit in the selected delay part selects a corresponding one of said delay elements.

3. A variable delay circuit comprising:

a variable delay part having n (≧2) cascade-connected delay parts, each of which has a delay element, a selecting circuit for selecting whether an input signal is allowed to pass through said delay element, and an OR gate for outputting an output of the selected delay element or said input signal; and control means for selecting at least one of said plurality of delay parts on the basis of desired delay time information to transmit a control signal for operating so that the selecting circuit in the selected delay part selects a corresponding one of said delay elements, wherein assuming that a variable width of a delay time is Span, a resolution being Res, the best and worst values of absolute errors of the whole delay time being dab and daw, respectively, and the best and worst values of relative errors of the delay time of a delay element of a number i (1≦i≦n) delay part being drbi and drwi, respectively, then, a designed delay time value Dk of the delay element of a number k (1≦k≦n) delay part meets the following conditions:

$D_1 = \text{Span}/(1-dab)/2$ $D_2 = (\text{Span}/(1-dab)/2) \times (1+drw1)/2$ when k≧3, $$D_k = \left\{ (\text{Span}/(1-dab)/2) \times (1+drwl) - \sum_{i=1}^{k-1} D_i \times (1-drbi) \right\} / 2$$

$$\text{Span} < \sum_{i=1}^{n} (D_i \times (1-dab))$$

$D_n \times (1+daw) \times (1+drwn) < \text{Res}.$

4. A variable delay circuit as set forth in claim 3, wherein said variable delay part is divided into a first variable delay part having m (2≦m≦n-2) cascade-connected delay parts, and a second variable delay part having n-m cascade-connected delay parts, said desired delay time information being a coded n-bit signal, said control means being divided into first and second control circuits, said first control circuit selecting one from said delay parts of said first variable delay part on the basis of upper m bits of said desired delay time information, and outputting a control signal for operating so that the selecting circuit in the selected delay part selects a corresponding delay element, said first control circuit having a table including information on the difference between the designed delay time value from said selected delay part and an actual delay time, and said second control circuit selecting one from said delay parts of said second variable delay part on the basis of said information on the difference outputted from said first control circuit, and outputting a control signal for operating so that the selecting circuit in the selected delay part selects a corresponding one of said delay elements.

5. A variable delay circuit comprising:

a variable delay part having n (≧2) cascade-connected delay parts, each of which has a delay element, a selecting circuit for selecting whether an input signal, is allowed to pass through said delay element, and an OR gate for outputting an output of the selected delay element or said input signal; and control means for selecting at least one of said plurality of delay parts on the basis of desired delay time information to transmit a control signal for operating so that the selecting circuit in the selected delay part selects a corresponding one of said delay elements, wherein assuming that a variable width of a delay time is Span, a resolution being Res, the best and worst values of absolute errors of the whole delay time being dab and daw, respectively, the best and worst values of relative errors of the delay time of a delay element of a number i (1≦i≦n) delay part being drbi and drwi, respectively, and OPT being a positive number, then, a designed delay time value $D_k$ of the delay element of a number k (1≦k≦n) delay part meets the following conditions:

$D_1 = \text{Span}/(1-dab)/2 - \text{OPT}$ $D_2 = \{\text{Span}/(1-dab)/2) \times (1+drw1) - \text{OPT}\}/2$ when k≧3, $$D_k = \left\{ (\text{Span}/(1-dab)/2) \times (1+drwl) - \text{OPT} - \sum_{i=1}^{k-1} D_i \times (1-drbi) \right\} / 2$$

$$\text{Span} < \sum_{i=1}^{n} (D_i \times (1-dab))$$

$D_n (1+daw) \times (1drwn) < \text{Res}.$

6. A variable delay circuit as set forth in claim 5, wherein said variable delay part is divided into a first variable delay part having m (2≦m≦n-2) cascade-connected delay parts, and a second variable delay part having n-m cascade-connected delay parts, said desired delay time information being a coded n-bit signal, said control means being divided into first and second control circuits, said first control circuit selecting one from said delay parts of said first variable delay part on the basis of upper m bits of said desired delay time information, and outputting a control signal for operating so that the selecting circuit in the selected delay part selects a corresponding delay element, said first control circuit having a table including information on the difference between the designed delay time value from said selected delay part and an actual delay time, and said second control circuit selecting one from said delay parts of said second variable delay part on the basis of said information on the difference outputted from said first control circuit, and outputting a control signal for operating so that the selecting circuit in the selected delay part selects a corresponding one of said delay elements.

* * * * *